United States Patent [19]

Miller

[11] 3,855,034

[45] Dec. 17, 1974

[54] METHOD AND APPARATUS FOR BONDING IN MINIATURIZED ELECTRICAL CIRCUITS

[76] Inventor: Charles Frederick Miller, 2165 North Glassell St., Orange, Calif. 92665

[22] Filed: Dec. 10, 1973

[21] Appl. No.: 423,321

[52] U.S. Cl. ............... 156/297, 29/203 V, 156/556, 156/578, 228/4

[51] Int. Cl. ..... B31f 5/00, B65c 11/04, H01r 43/00

[58] Field of Search ........... 156/285, 297, 556, 578; 29/203 V, 589, 40; 228/6, 4

[56] References Cited

UNITED STATES PATENTS

| | | | |
|---|---|---|---|
| 3,715,258 | 2/1973 | Cunnane | 156/578 |
| 3,785,903 | 1/1974 | Boyer et al. | 156/578 |

*Primary Examiner*—Douglas J. Drummond
*Attorney, Agent, or Firm*—Grover A. Frater

[57] ABSTRACT

An improved method and apparatus for using adhesives to bond one element to another in miniature electronic circuitry is provided by rotating a tool head to bring first an adhesive dispensing opening into line with the work place and then a suction opening into that line. The head is moved to move the openings in that line toward and away from the work place. A dot of adhesive is deposited while the adhesive dispensing opening is adjacent the work place and the element to be added is released to the adhesive by releasing suction while the suction opening is adjacent the dot of adhesive.

Rotational movement of the heads avoids the position errors that characterize earlier apparatus. While rotation of the tool head on an axis substantially parallel to the line of movement is within the invention, rotation on an axis more nearly perpendicular than parallel to that line is preferred.

10 Claims, 6 Drawing Figures

METHOD AND APPARATUS FOR BONDING IN MINIATURIZED ELECTRICAL CIRCUITS

This invention relates to improvements in method and means for employing adhesives in bonding one element to another.

An object of the invention is to provide an improved method and means by which an electronic element may be bonded to a substrate, or other mounting element, with a high order of position accuracy. The invention is suitable for wider application, but one of its primary uses is in the bonding of semi-conductor dice and capacitor chips in hybrid circuit assemblies.

Bonders of this kind deposit a small quantity of adhesive, ordinarily a silver or gold filled epoxy resin, at the point on the mounting element to which a dice or capacitor chip is to be fixed. A dot of epoxy, which may be only five or fewer mills in area, is deposited at the required position. Then the die or chip is placed upon the epoxy dot and released. It is not uncommon that the adhesive dot and the chip must be located on the mounting element with a cumulative position error in the order of one thousandths of an inch or less. While that kind of accuracy is not particularly difficult to achieve manually, using a stero microscope, it has been difficult to achieve rapidly and at low cost. An object of the invention is to overcome that difficulty in substantial degree and to provide a method and an apparatus which will permit rapid bonding with a very high order of position accuracy. The procedure requires identification of the point on the mounting element at which the component is to be added. A dot of epoxy is placed at that point and then the component is placed on the dot. A very substantial savings in time can be accomplished if the method and apparatus can be arranged so that only a single position locating step is required in locating both the adhesive dot and the element to be added. Prior systems that have sought to do that have moved either the tool or the work piece laterally from one position to another through a precisely measured distance. In some of these schemes, the work tool that places the epoxy dot and the work tool that places the chip on the epoxy are separated by a distance and in a direction that are precisely known. The work piece is mounted on a carrier which is arranged to move exactly through that distance and in that direction to carry the work piece from one tool to the other. In another scheme the work piece remains stationary and the tools are moved laterally to and from the work piece in controlled degree and direction. Both of these schemes give rise to unduly large and variable position error. Some errors tend to be cumulative, and they arise mostly because of the large amount of mass that must be transported from one position to another in systems employing those schemes.

The invention permits improved position accuracy and it accomplishes that result with a simple mechanism which may be operated at relative high speed without introducing inaccuracies that are the result of momentum forces. The invention makes use of a pair of tools, one for placing the adhesive dot and the other for moving the component into position over the adhesive. The two tools are mounted on a single tool head which is rotated to place one or the other tool in position. The adhesive placing tool is rotated so that it is in direct line with the position at which the component is to be bonded. Then it is moved along that line relative to the mounting element until it reaches a point at which the adhesive can be deposited on the work place. Next, the dispensing tool is retracted and the head is rotated to bring the circuit element carrier tool into position along that same line. The tool is then moved relatively toward the work place until the circuit element is deposited in contact with the adhesive dot. The circuit element is released from the tool and the tool is retracted.

A circuit element to be bonded may be picked up before or after the adhesive dot is deposited. Ordinarily, it would be picked up prior to deposition of the adhesive. In a preferred method, the chip or die is placed at the point on the work piece to which it is to be bonded prior to the work being brought to the bonding position. The work piece and the die or chip are then moved together to position under the tool head. The die or chip is picked up by the handling tool, advantageously by negative or suction pressure. The tool head is then rotated to bring the dispensing tool directly over that same position. After the adhesive is dispensed, the tool head is moved to bring the die or chip back directly over that same position. The tool then lowers the die or chip and releases it to the adhesive.

The method can be practiced by rotating the tool head on an axis which is parallel to the direction in which the tools are moved toward and away from the work place. Ordinarily, the tool rotation axis and direction of movement of those tools would be vertical, or nearly so. However, in the preferred form of the invention, the axis of tool head rotation is horizontal, or nearly so, so that it is perpendicular, or nearly perpendicular, to the vertical line along which the tools are moved to bring them into contact or close proximity to the work place.

The vertical movement of the tool head may be accomplished along a straight line or on the segment of an arc having a substantial radius. The embodiment of the apparatus of the invention that has been selected for illustration in the accompanying drawing employs a tool holder that is pivoted on a substantially horizontal axis. The tools move through a small arc in a vertical plane in their approach to the work place. The radius of that arc is sufficiently large so that the path of movement is nearly a straight line. That arrangement permits locating the actuating apparatus well away from the work place whereby a clear view of the work place is available.

The amount of vacuum employed in lifting the circuit element and the time and pressure employed to dispense the adhesive dot are best controlled mechanically under the control of an electrical controller. A system in which that result is achieved, and by which the method of the invention may be practiced, is shown schematically in the drawing. In the drawing.

Figures 1, 2, 3, 4, 5, 6:
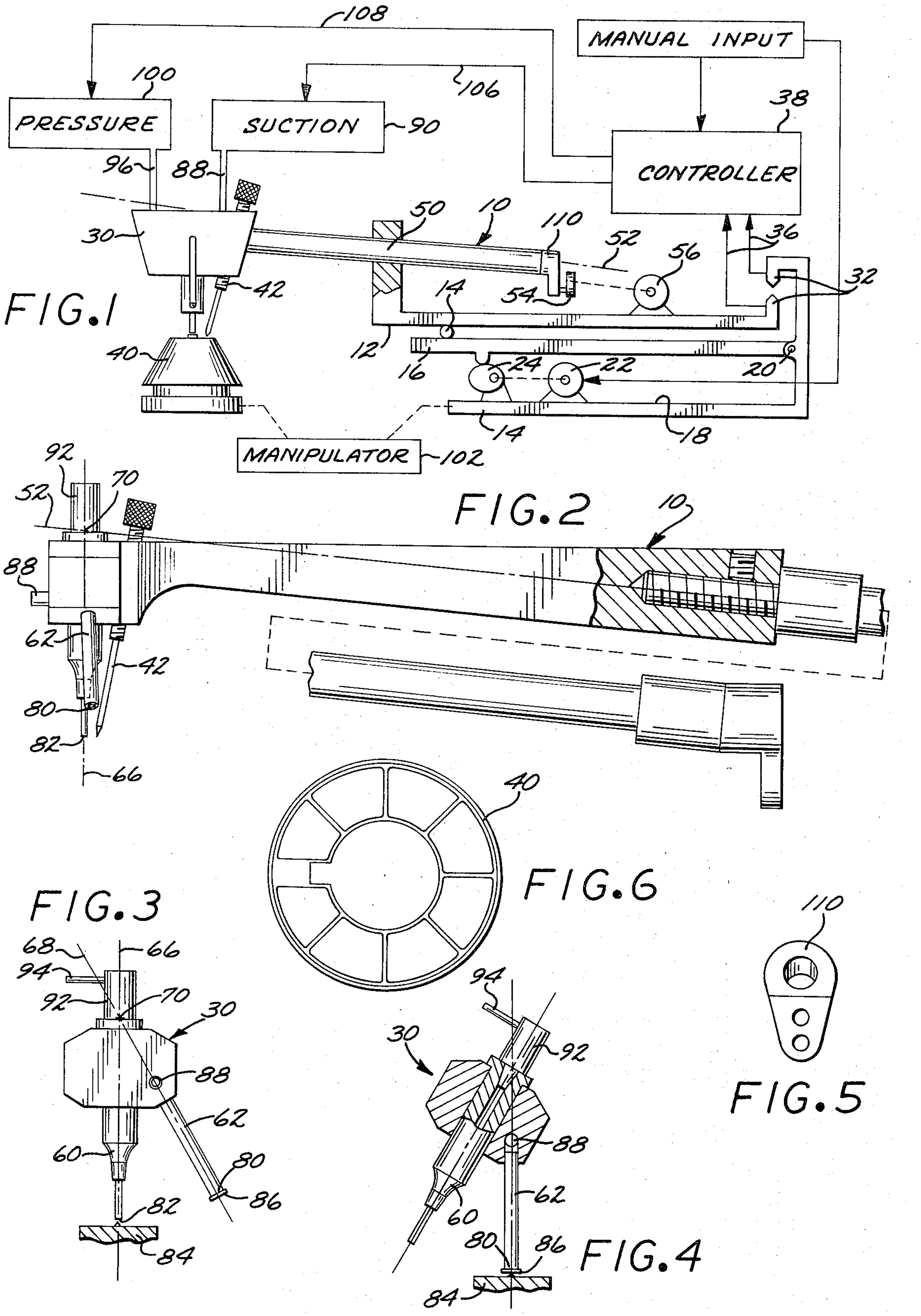
FIG. 1 is a schematic drawing of a system by which the method of the invention may be practiced and which embodies the invention.
FIG. 2 is a partially fragmented, partially sectioned, view of a tool holder shown in side elevation.
FIG. 3 is a view in front elevation of the tool holder in FIG. 2.
FIG. 4 is a partially sectioned view in front elevation of the tool holder of FIGS. 2 and 3 shown in another rotational position.
FIG. 5 is a view in end elevation of an element of the tool holder.

FIG. 6 is a top plan view of the work holder of FIG. 1. In FIG. 1 the tool holder 10 is mounted on a sub-carrier 12 which in turn has pivotal mounting at pivot 14 to a tool holder carrier 16. The carrier 16 is pivotally mounted on frame 18 at a pivot point 20. A motor 22, mounted on frame 18, drives a cam 24 which cooperates with a follower 26 fixed to the carrier 16. When the motor 22 rotates cam 24, the latter bears against follower 26 lifting and lowering the tool holder carrier 16 and the sub-carrier 12. As the sub-carrier moves up and down, so does the head 30 of the tool holder 10. By gravity, or otherwise, the tool holder 10 and the sub-carrier 12 are urged to counter-clockwise rotation about pivot pin 14 to the position shown. In that position, the two electrical contacts 32 are engaged. Being engaged, the contacts limit such counter-clockwise rotation. If the tool 10 and sub-carrier 12 are urged to clockwise rotation about pivot 14, the contacts 32 will open and a signal will be provided by lines 36 to a controller 38.

The head 30 of the tool holder 10 is positioned over a work holder 40. A positioning pin 42 is one of the elements that is mounted on head 30. The lower end of the pin projects downwardly toward the work holder 40. If the cam 24 should rotate sufficiently to lower carrier 16 and sub-carrier 12 and the holder 10 to the point where the lower end of pin 42 engages the work piece 40, the head 30 will have been lowered as far as it can go. Any further rotation of cam 24 to lower carrier 16 will result in relative clockwise rotation of sub-carrier 12 around pin 14, and the contacts 32 will separate and that event will be signalled to the controller 38 via lines 36.

The tool holder 10 is rotatably mounted in the sub-carrier 12 in a bearing located in the region identified by the numeral 50. The tool holder does not make a complete revolution, but it does oscillate about axis 52. It is made to oscillate by a crank 54 which is operated by a motor 56. Operation of crank 54 results in rotation of the head 30 from the position shown in FIG. 3 to the position shown in FIG. 4 and back again. The head 30 carries two tools. One of them is an adhesive dispensing tube 60, and the other is a vacuum tube 62. The dispensing tube 60 extends in the direction of its axis 66 and the vacuum tube 62 extends in the direction of its axis 68. Those axes intersect at a point 70 which, as best shown in FIG. 2, intersects the axis 52 of tool holder rotation. It will be apparent from an examination of FIGS. 2 and 3 that the axes 66 and 68 lie in a plane that is relatively close to being perpendicular to the axis 52 of tool holder rotation. That they are not perpendicular is not important. However, it is important that they are more perpendicular than they are parallel. This is the preferred form of the invention. As indicated above, it is possible to practice the invention with a structure in which the tool holder is rotatable to bring the tools into alignment with the work piece by rotation on a vertical axis nearly coincident or parallel to the line on which the tool is moved toward and away from the work piece.

It is only the position of the openings in the tubes, rather than the directions on which the bore of those tubes extend, that is important in the invention. An examination of FIGS. 2 and 3 will show that the lower end 80 of tube 62 and the lower end of 82 of tube 60 do lie in a plane which is substantially perpendicular to the axis 52.

In FIGS. 3 and 4 the element designated 84 is the mounting element on which the dice or chip or other electronic element is to be bonded. The bonding is to be accomplished on the work point 86. When the tool holder has one of its rotational positions, the end 82 of the adhesive dispenser 60 overlies that point 86. The height gauge pin 42 will have been adjusted so that downward motion of the tool holder and tool 60 stops a few thousandths of an inch above the mounting element 84. The vacuum tube 62 may be slightly longer than the epoxy dispensing tube 60 so that it, and the element it holds, will approach more closely to the mounting element 84 than will the end 82 of tube 60. In FIGS. 3 and 4 a dice 86 is shown to be held against the lower end 82 of the tube. It is held there by negative pressure, or vacuum, applied to tube 62 through the fitting 88 from a suction source 90, see FIG. 1.

In this embodiment the tube 60 is shaped somewhat like a syringe as best shown in FIG. 4. A container 92 is inserted into the upper end of tube 60. It contains an adhesive such, for example, as a silver or gold filled epoxy which is forced from the container into the tube 60 by pressure applied to the inlet fitting 94. As best shown in FIG. 1, that inlet fitting is connected by a conduit 96 to a source or pressure 100.

The top of the work holder 40 is shown in FIG. 7. It is divided into a number of trays into which are placed the mounting elements and the electronic elements to be bonded to them. The tool holder is rotatable about its central vertical axis so that successive trays can be brought under the tool holder. The tool holder is positioned with the aid of a manipulator 102 and a stereo microscope (not shown). The manipulator is connected between the work holder 40 and the frame 14, and may have the form shown in Charles F. Miller U.S. Pat. No. 3,474,685.

To practice the method of the invention, the dice or chip, and the substrate are placed in one of the trays of the work holder 40. Employing manual input to the controller 38, the latter is made to operate motor 56 so that the tool holder 10 is oscillated to the position shown in FIG. 4. The suction tube extends downwardly toward the work table. Using the manipulator and the stereo microscope, the tube 62 is placed directly over the dice 86. In response to another manual input the controller 38 supplies a signal to motor 22 which rotates cam 24 in a direction to lower the tool holder so that the end of the suction tube engages the element 86. Continued rotation of cam 24 will lower the carrier 16, resulting in rotation of the tool holder about pivot 14 sufficiently to open the contacts 32. When that happens, the controller supplies a signal by line 106 to the suction unit 90 and that unit applies a negative pressure by line 88 to the tube 62. The element 86 is now held firmly against the end of the tube. Shortly after the application of suction pressure the controller operates the motor 22 and cam 24 to lift the tool holder from the work piece in predetermined degree. Thereafter, the controller actuates the motor 56 and the crank 54 to make the tool holder oscillate. The holder is rotated, or oscillated, until the tube 60 has its lower end positioned in a vertical plane over the work area. Using the manipulator 102 the work piece 84 is positioned so that point 86 is directly below the opening 82 of tube 60. Application of another manual input signal to the controller results in energization of the motor 22 and rotation of cam 24 to lower the tool holder 10 toward point 86.

However, before the end of the tube 60 touches the work point 86, the pin 42 will have engaged the work holder causing the sub-carrier 12 to tilt and open contacts 32. That information is signalled by line 36 to the controller which then applies a signal by line 108 to the pressure source 100. Pressure is applied from that source through the conduit 96 and the fitting 94 to the container 92. The tube 60 having been filled with epoxy previously, the application of pressure forces a quantity of epoxy to emerge from opening 82. The amount of the pressure applied by source 100 and the period of pressure application determines how much epoxy will be dispensed from the tube. A tiny dot of epoxy will form at opening 82 and will engage the point 86 where it will adhere. After a short interval the controller 38 will cause the motor 22 to operate such that the tool is lifted from the work place. The tool having been lifted, the controller 38 will actuate the motor 56 to rotate the tool holder so that the suction tube 62 is again placed in vertical position.

FIG. 5 shows the lever 110 to which the crank 54 is connected and by which the tool holder 10 is made to oscillate.

Although I have shown and described certain specific embodiments of my invention, I am fully aware that many modifications thereof are possible. My invention, therefore, is not to be restricted except insofar as is necessitated by the prior art.

I claim:

1. The method of bonding one element to another element using a tool holder apparatus which includes a suction pick-up opening and an adhesive dispensing opening, said openings being separated by a distance and opening in like direction, the holder apparatus being rotatable to place both of said openings, one at a time, in a line extending in said direction and to move the opening so placed in the direction of said line, which method comprises the steps of:

rotating said apparatus to place the adhesive dispensing opening in said line and moving said apparatus to move said adhesive dispensing opening along said line;

causing a quantity of adhesive to be dispensed from said adhesive dispensing opening; and while applying suction at said suction pick-up opening, rotating said apparatus to place said suction pick-up opening in said line and moving said apparatus such that said suction pick-up opening is moved in the direction of that line toward the point at which said quantity of adhesive was dispensed; and ending application of suction to said suction pick-up opening.

2. The method of bonding electronic elements to a mounting element using a tool holder apparatus which includes a suction pick-up tube and an adhesive dispensing tube, the end openings of which tubes lie in a common plane and on different radial lines which intersect at an axial line extending substantially perpendicular to said common plane, which method comprises the steps of:

rotating said apparatus about said axial line to place said end opening of the adhesive dispensing tube in a verticle plane which lies parallel to said axial line;

causing a quantity of adhesive to be dispensed from said end opening of the adhesive dispensing tube;

while applying suction to said suction tube, rotating said apparatus about said axial line to place said end opening of the suction tube in said verticle plane; and ending application of suction to said suction tube.

3. The method set forth in Claim 2 which comprises the further steps:

placing a mounting element at a point lying in said common plane and in said vertical plane; and raising said tool holder apparatus to elevate the ends of said tubes above said mounting element before rotating said tool holder apparatus and lowering said apparatus to place said ends of the tubes at a point adjacent to said mounting element when causing said adhesive to be dispensed and when ending application of suction to said suction tube.

4. The invention defined in claim 3 which comprises the further step of:

picking up an electronic element by placing said opening of said suction tube over said electronic element and applying the suction to said suction tube.

5. In an apparatus for bonding electronic elements to a mounting element;

means for holding a mounting element such that a portion thereof is positioned at a work place;

a tool holder rotatable about an axis;

an adhesive dispensing tube and a suction tube, both extending from said holder and each ending in an opening lying in a plane which is substantially perpendicular to said axis, said openings lying on different radial lines which intersect on said axis; and means for rotating and raising and lowering said tool holder selectively to place said openings of said tubes in proximity to said work place.

6. The invention defined in claim 5 which further comprises means for forcing a quantity of adhesive from said adhesive dispensing tube when said end thereof is positioned in close proximity to said work place; and means for applying suction to said suction tube, and for releasing said suction when said end of said suction tube is positioned in close proximity to said work place.

7. The invention defined in claim 5 in which said tool holder comprises:

a head formed with two bores of which axes intersect at a point; an arm; and means for rotating said arm;

means for rotating said arm such that first one, and then other of said bores has its axis lying in a verticle plane.

8. The invention defined in claim 5 which further comprises a frame member and a tool holder carrier pivotally mounted on the frame member such that upon being pivoted relative to the frame member, said tool holder, and said tubes, are moved in the direction toward and away from said means for holding a mounting element.

9. The invention defined in claim 8 which further comprises limiting means for limiting the degree of movement of said adhesive dispensing tube toward said work place; and means responsive to movement of said adhesive dispensing tube to the limit of movement toward said work place for applying pressure to said adhesive dispensing tube.

10. In an apparatus for bonding a first element to a second element at a work place:

a tool holder;

means in the form of an opening movable with said holder for lifting and depositing the first element;

means in the form of an opening movable with said holder for dispensing a dot of adhesive;

means for rotating said holder about an axis to place both of said openings, one at a time, in a line extending through said work place; and means for moving said holder relatively to said work place to move the opening in said line, along the line toward and away from said work place.

* * * * *